(12) United States Patent
Yang

(10) Patent No.: US 9,455,016 B2
(45) Date of Patent: Sep. 27, 2016

(54) SEMICONDUCTOR DEVICE

(71) Applicant: SK hynix Inc., Gyeonggi-do (KR)

(72) Inventor: Jong-Yeol Yang, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 68 days.

(21) Appl. No.: 14/106,823

(22) Filed: Dec. 15, 2013

(65) Prior Publication Data

US 2015/0063049 A1 Mar. 5, 2015

(30) Foreign Application Priority Data

Sep. 2, 2013 (KR) .................... 10-2013-0104766

(51) Int. Cl.
*G11C 8/00* (2006.01)
*G11C 11/406* (2006.01)
*G11C 29/00* (2006.01)

(52) U.S. Cl.
CPC .......... *G11C 11/406* (2013.01); *G11C 29/783* (2013.01); *G11C 11/40618* (2013.01)

(58) Field of Classification Search
USPC ........................................ 365/222
See application file for complete search history.

(56) References Cited

U.S. PATENT DOCUMENTS

| 4,829,484 A * | 5/1989 | Arimoto | G11C 11/406 365/189.05 |
| 2001/0008496 A1* | 7/2001 | Leung | G06F 13/1636 365/223 |
| 2002/0080657 A1* | 6/2002 | Mine | G11C 11/406 365/200 |
| 2003/0043672 A1* | 3/2003 | Inoue | G11C 11/406 365/222 |
| 2005/0052928 A1* | 3/2005 | Koshikawa | G11C 11/406 365/222 |
| 2006/0056256 A1* | 3/2006 | Takai | G11C 11/406 365/222 |

FOREIGN PATENT DOCUMENTS

| KR | 1020030055747 | 7/2003 |
| KR | 1020120131423 | 12/2012 |

* cited by examiner

*Primary Examiner* — Hoai V Ho
*Assistant Examiner* — Pablo Huerta
(74) *Attorney, Agent, or Firm* — IP & T Group LLP

(57) ABSTRACT

A semiconductor device includes a memory cell array including a normal memory cell array and a redundancy memory cell array, a normal refresh counter suitable for generating a normal address for performing a refresh operation to the normal memory cell array with a first period during a refresh mode and a redundancy refresh counter suitable for generating a redundancy address for performing a refresh operation to the redundancy memory cell with a second period shorter than the first period.

15 Claims, 2 Drawing Sheets

SEMICONDUCTOR DEVICE

CROSS-REFERENCE TO RELATED APPLICATIONS

The present application claims priority of Korean Patent Application No. 10-2013-0104766, filed on Sep. 2, 2013, which is incorporated herein by reference in its entirety.

BACKGROUND

1. Field

Exemplary embodiments of the present invention relate to a semiconductor design technology, and more particularly, to a semiconductor device for performing a refresh operation.

2. Description of the Related Art

As well-known in the art, a semiconductor device includes a memory cell having one transistor and one capacitor. Data is stored by charging a charge on the capacitor. Since a leakage current occurs in the capacitor, the charge stored on the capacitor is subject to loss without recharging. The semiconductor device should perform a refresh operation to maintain the charge stored on the capacitor.

More specifically, in the semiconductor device, a high electric potential is applied to the memory cell when data of '1' is to be stored therein and a low electric potential is applied to the memory cell when data of '0' is to be stored therein. The capacitor constituting the memory cell is designed in such manner that an electric charge therein should be always maintained in an ideal memory cell when there is no electrical change. In fact, however, the capacitor loses the electric charge stored therein in the form of a leakage current as time goes by, which means the electric charge stored therein may not be maintained and makes it impossible to identify whether the stored data is '1' or '0'. Therefore, it is necessary to perform a series of processes that periodically senses data stored in each memory cell and again restores it therein in order to maintain data in the memory cell. This series of processes is called the refresh operation.

FIG. 1 is a circuit diagram illustrating a conventional refresh signal generator.

Referring to FIG. 1, a refresh signal AFACT for generating a refresh command RE is generated by logically combining a chip select signal CS, a row address strobe signal RAS, a column address strobe signal CAS and a write enable signal WE, which are external signals inputted from outside.

The refresh signal generator generate the refresh signal AFACT of a logic high in response to the chip select signal CS of the logic high, the row address strobe signal RAS of the logic high, the column address strobe signal CAS of the logic high and the write enable signal WE of a logic low.

A semiconductor device, during a refresh operation mode, sequentially changes an internal address and may enable word lines according the internal address in response to an external command, e.g., the refresh signal AFACT as shown in FIG. 1. During the refresh operation mode according to the external command, a row address is sequentially increased at a predetermined period and a corresponding word line of the memory cell is selected. A charge stored in the memory cell of the enabled word line is sensed, amplified, and re-stored. Through the refresh operation, the data stored in the memory cell maintains without loss.

A target row refresh (TRR) operation is to prevent data loss of adjacent memory cells, which may be caused by excessive activation of a word line. During the TRR operation, an active and precharge operation for adjacent word lines as well as a target word line is performed. Through the TRR operation, the adjacent memory cell may be secured even though the excessive activation of the target word line.

However, in order for a redundancy word line to be activated and precharged as the target word line during the TRR operation, a circuit for the TRR operation to the redundancy word line needs to be complicated and more space for the circuit may be required, which makes it hard to reduce size of the semiconductor device and fabricating cost of the semiconductor device.

SUMMARY

Exemplary embodiments of the present invention are directed to a semiconductor device for controlling a refresh cycle for a redundancy memory cell.

In accordance with an embodiment of the present invention a semiconductor device may include a memory cell array including a normal memory cell array and a redundancy memory cell array, a normal refresh counter suitable for generating a normal address for performing a refresh operation to the normal memory cell array with a first period during a refresh mode and a redundancy refresh counter suitable for generating a redundancy address for performing a refresh operation to the redundancy memory cell with a second period shorter than the first period.

The semiconductor device may further include a redundancy period control unit suitable for controlling the second period.

The semiconductor device may further include a normal row decoder suitable for selecting the normal memory cell array in response to the normal address, and a redundancy row decoder suitable for selecting the redundancy memory cell array in response to the redundancy address.

The normal refresh counter and the redundancy refresh counter may do not operate at the same time.

The refresh mode may be activated in response to a self refresh signal or an auto refresh signal generated by decoding an external command signal.

In accordance with another embodiment of the present invention, a semiconductor device may include a memory cell array including a normal memory cell array and a redundancy memory cell array, a normal refresh counter suitable for generating a normal address for performing a refresh operation with a predetermined normal period to the normal memory cell array during a refresh mode and a redundancy refresh counter suitable for generating a redundancy address for performing a refresh operation to the redundancy memory cell twice or more within the predetermined normal period.

In accordance with another embodiment of the present invention, a semiconductor device may include a normal refresh unit suitable for refreshing a plurality of normal word lines, to each of which a plurality of normal memory cells are coupled, a redundancy refresh unit suitable for refreshing a plurality of redundancy word lines, to each of which a plurality of redundancy memory cells are coupled and a control unit suitable for controlling the normal refresh unit and the redundancy refresh unit so that the refreshing of the normal refresh unit alternates with the refreshing of the redundancy refresh unit, wherein a period of the refreshing of the normal refresh unit is greater than a period of the refreshing of the redundancy refresh unit.

DETAILED DESCRIPTION

Figure 1:
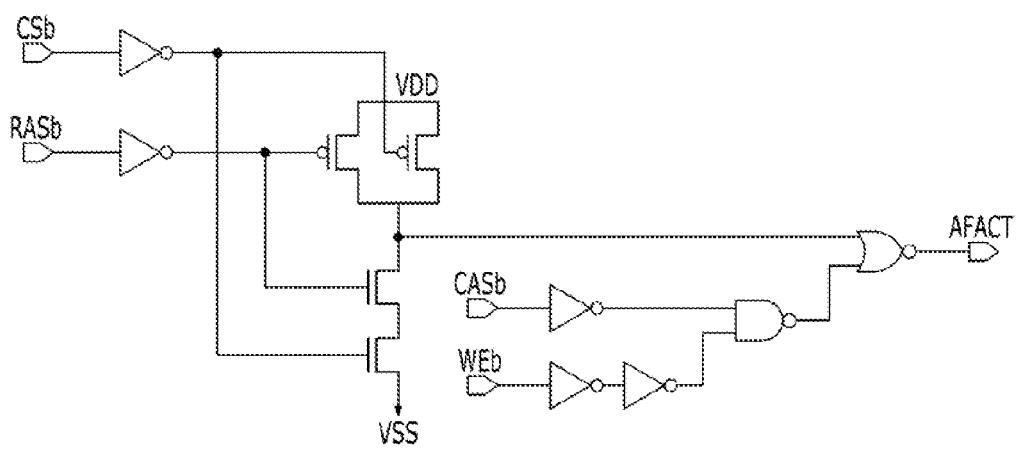
FIG. 1 is a circuit diagram illustrating a conventional refresh signal generator.

Exemplary embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, reference numerals correspond directly to the like parts in the various figures and embodiments of the present invention.

The drawings are not necessarily to scale and in some instances, proportions may have been exaggerated in order to clearly illustrate features of the embodiments. In this specification, specific terms have been used. The terms are used to describe the present invention, and are not used to qualify the sense or limit the scope of the present invention.

It is also noted that in this specification, 'and/or' represents that one or more of components arranged before and after 'and/or' is included. Furthermore, "connected/coupled" refers to one component not only directly coupling another component but also indirectly coupling another component through an intermediate component. In addition, a singular form may include a plural form as long as it is not specifically mentioned in a sentence. Furthermore, 'include/comprise' or 'including/comprising' used in the specification represents that one or more components, steps, operations, and elements exists or are added.

Figure 2:
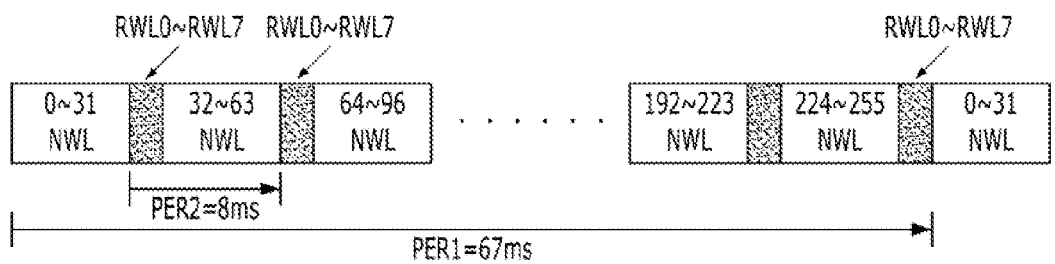
FIG. 2 is a timing diagram illustrating refresh periods of a normal memory cell and a redundancy memory cell of a semiconductor device in accordance with an exemplary embodiment of the present invention.

FIG. 2 is a timing diagram illustrating refresh periods of a normal memory cell and a redundancy memory cell of a semiconductor device in accordance with an exemplary embodiment of the present invention.

Referring to FIG. 2, the semiconductor device may perform a refresh operation to both of a normal memory cell and a redundancy memory cell with respective refresh periods.

In the description, 256 normal word lines NWL0 to NWL255 and 8 redundancy word lines RWL0 to RWL7 are taken as an example for clear understanding.

A normal word line may be refreshed for a first period PER1, e.g., 67 ms, and a redundancy word line may be refreshed for a second period PER2, e.g., 8 ms. During the refresh operation to the normal word lines NWL0 to NWL255 is performed once for the first period PER1, e.g., 67 ms, the refresh operation to the redundancy word lines RWL0 to RWL7 may be performed eight times.

For example, net time for completion of the refresh operation to the normal word lines NWL0 to NWL255 may be 64 ms. However, the period PER1 of the refresh operation to the normal word lines NWL0 to NWL255 is 67 ms as shown in FIG. 2 because of alternative refresh operations to the normal word lines NWL0 to NWL255 and the redundancy word lines RWL0 to RWL7. Since the refresh operation is performed on the redundancy word line in the middle of the refresh operation of the normal memory cell, the period of the normal word line becomes longer than the net time due to the alternative refresh operations.

When the period PER1 of the refresh operation to the normal word lines NWL0 to NWL255 is set to be lesser than 67 ms in spite of the alternative refresh operations to the normal word lines NWL0 to NWL255 and the redundancy word lines RWL0 to RWL7, a noise may occur in the refresh operation. In accordance with the embodiment of the present invention, the semiconductor device may prevent the noise due to the short period of the refresh operations by extending the refresh period of the normal word line to 67 ms.

In accordance with the embodiment of the present invention, even though there may be excessive activation of the redundancy word line, a deterioration of an adjacent memory cell may be prevented by performing the refresh operation to the redundancy word lines more frequently than the refresh operation to the normal word lines. Thus, the semiconductor device in accordance with the embodiment of the present invention may have the same effect to the redundancy word line as the TRR operation.

Figure 3:
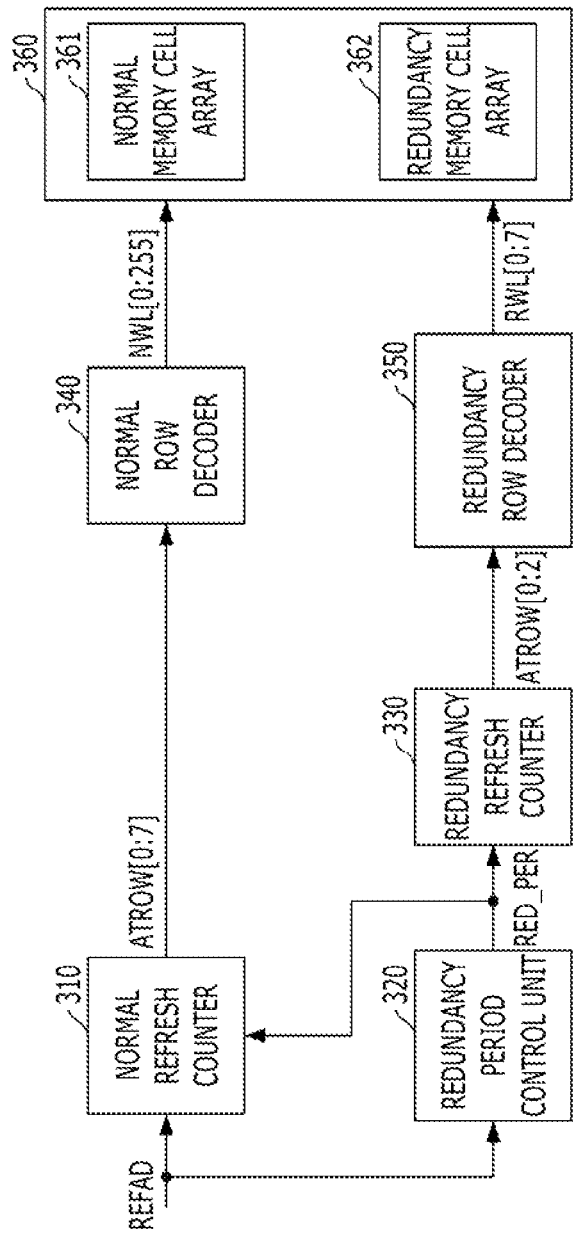
FIG. 3 is a block diagram illustrating a semiconductor device in accordance with an exemplary embodiment of the present invention.

FIG. 3 is a block diagram illustrating a semiconductor device in accordance with an exemplary embodiment of the present invention.

Referring to FIG. 3, the semiconductor device may include a normal refresh counter 310, a redundancy period control unit 320, a redundancy refresh counter 330, a normal row decoder 340, a redundancy row decoder 350 and a memory cell array 360. The memory cell array 360 may include a normal memory cell array 361 having the normal word lines NWL0 to NWL255 and a redundancy memory cell array 362 having the redundancy word lines RWL0 to RWL7. A normal memory cell of the normal memory cell array 361 may be coupled to the normal word lines NWL0 to NWL255. A redundancy memory cell of the redundancy memory cell array 362 may be couple to the redundancy word lines RWL0 to RWL7. The memory cells are refreshed through refresh operation to the corresponding word lines.

The normal refresh counter 310 may perform a counting operation in response to a refresh signal REFAD during the refresh operation and generate a normal address ATROW [0:7] for performing the refresh operation to the normal word lines NWL0 to NWL255 of the normal memory cell array 361. The refresh signal REFAD may be one of an auto refresh signal, a self refresh signal, which is generated by decoding an external command signal such as a chip select signal, a row address strobe signal, a column strobe address signal, and a write enable signal.

The redundancy period control unit 320 may generate a redundancy period signal RED_PER for controlling an activation of the redundancy refresh counter 330 and the normal refresh counter 310. When the redundancy period signal RED_PER is activated, the normal refresh counter 310 may stop the counting operation and the redundancy refresh counter 330 may start a counting operation. When the redundancy period signal RED_PER is deactivated, the normal refresh counter 310 may resume the counting operation and the redundancy refresh counter 330 may stop the counting operation. That is, the operations of the normal refresh counter 310 and the redundancy refresh counter 330 may not overlap in time, which represents that the refresh operations to the normal word lines NWL0 to NWL255 and the redundancy word lines RWL0 to RWL7 may not overlap in time and that the refresh operation to the normal word lines NWL0 to NWL255 alternates with the refresh operation to the redundancy word lines RWL0 to RWL7 such as shown in FIG. 2. The redundancy period signal RE_PER may control the activation period of the redundancy refresh counter 330. The activation period of the redundancy period signal RED_PER may be adjusted by an external control signal or an internal control signal.

The refresh counter 330 may generate a redundancy address ATROW[0:2] for the refresh operation to the redundancy word lines RWL0 to RWL7.

The normal row decoder 340 may generate a normal word line signal NWL[0:255] in response to the normal address ATROW[0:7] outputted from the normal refresh counter 310. The normal word line signal NWL[0:255] may enable corresponding one of the normal word lines NWL0 to NWL255.

The redundancy row decoder 350 may generate a redundancy word line signal RWL[0:7] in response to the redundancy address ATROW[0:2] outputted from the redundancy refresh counter 330. The redundancy word line signal RWL [0:7] may enable corresponding one of the redundancy word lines.

Hereinafter, a refresh operation of the semiconductor device in accordance with an embodiment of the present invention will be described.

The normal refresh counter 310 may generate the normal address ATROW[0:7] for performing a refresh operation to the normal word lines NWL0 to NWL255 during a first period PER1, e.g., 67 ms as shown in FIG. 2. The normal row decoder 340 may generate the normal word line signal NWL[0:25], which may enable the corresponding normal word line of the normal word lines NWL0 to NWL255, in response to the normal address TROW[0:7]. Thus, data stored on the normal memory cell of the memory cell array 360, which is enabled in response to the normal word line signal NWL[0:255], may be refreshed.

when the redundancy period signal RED_PER is activated according to the second period PER2, which may be preset in the redundancy period control unit 320, the normal refresh counter 310 may stop performing the refresh operation to the normal word lines NWL0 to NWL255, and the redundancy refresh counter 330 may start the counting operation and generate the redundancy address ATROW[0:2] for performing the refresh operation to the redundancy word lines RWL0 to RWL7. The second period PER2 may be shorter than the first period PER1 and activated twice or more within the first period PER such as described with respect to FIG. 2. The redundancy row decoder 350 may generate the redundancy word line signal RWL[0:7], which may enable the corresponding redundancy word line of the redundancy word lines RWL0 to RWL7, in response to the redundancy address ATROW[0:2]. Thus, the data stored on the redundancy memory cell of the memory cell array 360, which is enabled in response to the redundancy word line signal RWL[0:7], may be refreshed.

When the redundancy period signal RED_PER is deactivated, which may mean that the refresh operation to all of the redundancy word lines RWL0 to RWL7 is completed, the normal refresh counter 310 in response to the deactivation of the redundancy period signal RED_PER may resume the counting operation, which start from the value lastly stopped before resuming, and generate the normal address ATROW[0:7] for performing the refresh operation to the normal word lines NWL0 to NWL255 of the normal memory cell array 361. That is, the operations of the normal refresh counter 310 and the redundancy refresh counter 330 may not overlap in time. The refresh operations to the normal word lines NWL0 to NWL255 and the redundancy word lines RWL0 to RWL7 may not overlap in time and the refresh operation to the normal word lines NWL0 to NWL255 alternates with the refresh operation to the redundancy word lines RWL0 to RWL7 such as shown in FIG. 2.

The semiconductor device in accordance with an embodiment of the present invention may perform the refresh operation to the redundancy word lines twice or more whenever the redundancy period RED_PER are activated while the refresh operation to the normal word lines is performed once. That is, as shown in FIG. 2, the refresh operation to the redundancy word lines may be performed more often due to the shortened refresh period of the redundancy word lines compared to the refresh period of the normal word lines.

Therefore, in accordance with the embodiment of the present invention, even though there may be excessive activation of the redundancy word line, a deterioration or error of an adjacent cell memory may be prevented. Thus, the semiconductor device in accordance with the embodiment of the present invention may have the same effect to the redundancy word line as the TRR operation.

While the present invention has been described with respect to the specific embodiments, it will be apparent to those skilled in the art that various changes and modifications may be made without departing from the spirit and scope of the invention as defined in the following claims.

What is claimed is:

1. A semiconductor device, comprising:
   a memory cell array including a normal memory cell array and a redundancy memory cell array;
   a normal refresh counter configured to generate a normal address for performing a refresh operation to the normal memory cell array with a first period during a refresh mode;
   a redundancy refresh counter configured to generate a redundancy address for performing a refresh operation to the redundancy memory cell with a second period shorter than the first period; and
   a redundancy period control unit configured to generate a redundancy period signal for controlling activation of the normal refresh counter and the redundancy refresh counter so that when the redundancy period signal is activated, the normal refresh counter stops a first counting operation and the redundancy refresh counter starts a second counting operation, and when the redundancy period signal is deactivated, the normal refresh counter resumes the first counting operation and the redundancy refresh counter stops the second counting operation.

2. The semiconductor device of claim 1, further comprising:
   a normal row decoder configured to select the normal memory cell array in response to the normal address; and
   a redundancy row decoder configured to select the redundancy memory cell array in response to the redundancy address.

3. The semiconductor device of claim 1, wherein the normal refresh counter and the redundancy refresh counter do not operate at the same time.

4. The semiconductor device of claim 1, wherein the refresh mode is activated in response to a self refresh signal or an auto refresh signal generated by decoding an external command signal.

5. A semiconductor device, comprising:
a memory cell array including a normal memory cell array and a redundancy memory cell array;
a normal refresh counter configured to generate a normal address for performing a refresh operation with a predetermined normal period to the normal memory cell array during a refresh mode;
a redundancy refresh counter configured to generate a redundancy address for performing a refresh operation to the redundancy memory cell twice or more within the predetermined normal period; and
a redundancy period control unit configured to generate a redundancy period signal for controlling activation of the normal refresh counter and the redundancy refresh counter so that when the redundancy period signal is activated, the normal refresh counter stops a first counting operation and the redundancy refresh counter starts a second counting operation, and when the redundancy period signal is deactivated, the normal refresh counter resumes the first counting operation and the redundancy refresh counter stops the second counting operation.

6. The semiconductor device of claim 5, further comprising:
a normal row decoder configured to select the normal memory cell array in response to the normal address; and
a redundancy row decoder configured to select the redundancy memory cell array in response to the redundancy address.

7. The semiconductor device of claim 5, wherein the normal refresh counter and the redundancy refresh counter do not operate at the same time.

8. The semiconductor device of claim 5, wherein the refresh mode is activated in response to a self refresh signal or an auto refresh signal generated by decoding an external command signal.

9. A semiconductor device comprising:
a normal refresh unit configured to refresh a plurality of normal word lines, to each of which a plurality of normal memory cells are coupled;
a redundancy refresh unit configured to refresh a plurality of redundancy word lines, to each of which a plurality of redundancy memory cells are coupled; and
a control unit configured to generate a redundancy period signal for controlling activation of the normal refresh unit and the redundancy refresh unit so that when the redundancy period signal is activated, the normal refresh unit stops and the redundancy refresh unit starts, and when the redundancy period signal is deactivated, the normal refresh unit resumes and the redundancy refresh unit stops thereby controlling the normal refresh unit and the redundancy refresh unit so that the refreshing of the normal refresh unit alternates with the refreshing of the redundancy refresh unit,
wherein a period of the refreshing of the normal refresh unit is greater than a period of the refreshing of the redundancy refresh unit.

10. The semiconductor device of claim 9, wherein the control unit controls the normal refresh unit and the redundancy refresh unit so that the redundancy refresh unit refreshes the plurality of redundancy word lines twice or more while the normal refresh unit refreshes the plurality of normal word lines once.

11. The semiconductor device of claim 10, wherein the control unit controls the redundancy refresh unit so that the redundancy refresh unit refreshes the plurality of redundancy word lines once at each turn of the alternation.

12. The semiconductor device of claim 11, wherein the control unit controls the normal refresh unit so that the redundancy refresh unit refreshes part of the plurality of redundancy word lines at each turn of the alternation.

13. The semiconductor device of claim 12, wherein the normal refresh unit comprises a normal refresh counter configured to generate a normal address for the plurality of normal word lines.

14. The semiconductor device of claim 12, wherein the redundancy refresh unit comprises a redundancy refresh counter configured to generate a redundancy address for the plurality of redundancy word lines.

15. The semiconductor device of claim 9, wherein the control unit controls the normal refresh unit and the redundancy refresh unit so that the refreshing of the normal refresh unit alternates with the refreshing of the redundancy refresh unit without overlap in time.

* * * * *